US006646431B1

(12) United States Patent
Parvez et al.

(10) Patent No.: US 6,646,431 B1
(45) Date of Patent: Nov. 11, 2003

(54) TEST HEAD MANIPULATOR

(75) Inventors: Zafar Parvez, Sunnyvale, CA (US); David Erskine, Mountain View, CA (US); Fred E. Latimore, Gilroy, CA (US)

(73) Assignee: Elite E/M, Inc., Sunnyvale, CA (US)

( * ) Notice: Subject to any disclaimer, the term of this patent is extended or adjusted under 35 U.S.C. 154(b) by 87 days.

(21) Appl. No.: 10/056,146

(22) Filed: Jan. 22, 2002

(51) Int. Cl.[7] .................. G01R 31/02; G01D 21/00
(52) U.S. Cl. ...................... 324/158.1; 73/866.5
(58) Field of Search ................ 324/754, 755, 324/758, 765, 158.1; 414/590; 73/865.7, 865.9, 866.5

(56) References Cited

U.S. PATENT DOCUMENTS

| | | |
|---|---|---|
| 4,527,942 A | 7/1985 | Smith |
| 4,588,346 A | 5/1986 | Smith |
| 4,589,815 A | 5/1986 | Smith |
| 4,705,447 A | 11/1987 | Smith |
| 4,893,074 A | 1/1990 | Holt et al. |
| 4,973,015 A | 11/1990 | Beaucoup et al. |
| 5,030,869 A | 7/1991 | Holt et al. |
| 5,149,029 A | 9/1992 | Smith |
| 5,241,870 A | 9/1993 | Holt |
| 5,440,943 A | 8/1995 | Holt et al. |
| 5,450,766 A | 9/1995 | Holt |
| 5,506,512 A | 4/1996 | Tozawa et al. |
| 5,600,258 A | 2/1997 | Graham et al. |
| 5,606,262 A | 2/1997 | Montalbano et al. |
| 5,608,334 A | 3/1997 | Holt |
| 5,821,440 A | 10/1998 | Khater et al. |
| 5,900,737 A | 5/1999 | Graham et al. |
| 5,931,048 A | 8/1999 | Slocum et al. |
| 5,949,002 A | 9/1999 | Alden |
| 5,964,445 A | 10/1999 | Pikovsky et al. |
| 6,006,616 A | 12/1999 | Baker |
| 6,023,173 A | 2/2000 | Khater et al. |
| 6,031,387 A | 2/2000 | Berar |
| 6,057,695 A | 5/2000 | Holt et al. |
| 6,133,726 A * | 10/2000 | Heigl ...................... 324/158.1 |
| 6,271,657 B1 | 8/2001 | Nemoto |

* cited by examiner

*Primary Examiner*—Vinh P. Nguyen
*Assistant Examiner*—Ming N. Tang
(74) *Attorney, Agent, or Firm*—Pennie & Edmonds LLP

(57) ABSTRACT

The test head manipulator comprises two bearings coupled to a frame. A lead screw is rotatably disposed between the two bearings. A non-translation mechanism is also provided to prevent the lead screw from translating along its longitudinal axis. A lead nut is threaded onto the lead screw, but is prevented from rotating about the longitudinal axis by a non-rotation mechanism. A carriage configured to couple with an electronic test head is coupled to the lead nut by means of a system of cables and pulleys. Therefore, when the lead screw is rotated, the lead nut translates along the longitudinal axis, moving the cables and translating the carriage and test head along a vertical path. The lead screw and nut are non-backdrivable to lock the carriage in position.

35 Claims, 6 Drawing Sheets

TEST HEAD MANIPULATOR

BACKGROUND OF THE INVENTION

1. Field of the Invention

The present invention relates generally to semiconductor device testing, and more particularly to the field of test head positioners or manipulators.

2. Description of Related Art

Typically, individual semiconductors or integrated circuit (IC) devices are formed on a semiconductor wafer in a matrix array, where each IC has a plurality of electrical contact portions or pads formed on the edge or surface of the IC. Moreover, both during and following fabrication, IC devices are automatically tested to determine whether their circuits meet design specifications. Such tests are generally carried out using a test head, otherwise known as a testing head, IC tester, or the like. In use, the test head is accurately aligned and docked with an IC device handler. The IC device handler then positions each IC device to be tested in a location where electrical contact can be made between the test head and the IC device. Testing then occurs to determine whether the IC device's circuits meet design specifications.

To ensure a high throughput of IC devices being tested, the test heads typically test multiple IC devices simultaneously. Also, to increase the speed and accuracy of each test, the signal path between each IC device and the test equipment must be kept to a minimum. This requires a test head with a high density of sophisticated electronic components located close to the interface with the IC device handler. Consequently, test heads are very large and heavy—typically 300 kilograms or more.

This size and weight makes it difficult to manipulate or position the test head. During use it is often required to undock the test head from the IC device handler and move the test head to another location on the test facility floor. To accomplish the task of both moving the test head to another location on the test facility floor and accurately aligning the test head with an IC device handler, a test head positioner or manipulator is used. Examples of such test head manipulators can be found in U.S. Pat. Nos. 4,973,015; 5,241,870; 5,440,943; 5,450,766; 5,506,512; 5,606,262; 5,931,048; 5,949,002; 6,006,616; and 6,023,173, all of which are hereby incorporated by reference.

Most of these test head manipulators use counterweights, hydraulics, pneumatics, or electrical actuators to manipulate the test head and hold it in position. A disadvantage of counterweight systems is that the overall weight of the test head manipulator is significantly increased, adversely affecting its portability. Moreover, these test head manipulators are complex, necessitate additional structural, floor, and seismic tie-down support. These test head manipulators are also expensive to manufacture, ship, and use. They also incorporate stored energy that poses a potential safety hazard for users of the test head manipulators. Additionally, hydraulic systems pose cleanliness issues due to leakage.

Accordingly, a test head manipulator that is safe, simple, and inexpensive to make and use, and that does not require counterbalance weights, hydraulics, pneumatics, or locking mechanisms, would be highly desirable.

BRIEF SUMMARY OF THE INVENTION

According to the invention there is provided a test head manipulator. The test head manipulator comprises at least one, but preferably two, bearings coupled to a stationary object, such as a frame. A lead screw that can rotate about its longitudinal axis, is positioned between the bearings. A non-translation mechanism is provided to prevent the lead screw from translating along its longitudinal axis. In a preferred embodiment, one of the bearings is a thrust bearing that provides the non-translation mechanism to prevent the lead screw from translating along its longitudinal axis. In this embodiment, the other bearing is preferably a radial bearing, which assures the alignment of the lead screw.

A lead nut is threaded onto the lead screw and is prevented from rotating about the longitudinal axis by a non-rotation mechanism. The non-rotation mechanism preferably includes a linear bearing slidingly coupled to a shaft, which is oriented substantially parallel to the lead screw's longitudinal axis. The linear bearing is also rigidly coupled to the lead nut, thereby preventing rotation of the nut. Consequently, when the lead screw is rotated, the lead nut and linear bearing translate along the lead screw.

A carriage constrained to move along a vertical path is coupled to the lead nut by means of a cable and pulley system. The carriage is also configured to couple to an electronic test head.

In use, when the lead screw is rotated, the lead nut translates along the longitudinal axis, moving the cables and translating the carriage and test head along a vertical path.

The lead angle of the lead screw and lead nut is such that the lead screw cannot be turned by axial pressure on the lead nut. The test head can only be moved vertically by turning the lead screw, and thereby moving the lead nut. Since axial pressure on the lead screw by the lead nut cannot turn the lead screw, the lead nut and the coupled carriage and test head will be held in position without input.

In addition, the test head manipulator provides for rotational motion of the test head about two orthogonal axes. One of the axes has a worm drive mechanism (rotary drive) which facilitates rotational positioning of the test head. The lead angle of the worm gear is chosen such that the test head will be held in position without active input.

Accordingly, the present invention addresses the problems of the prior art by providing a safe, simple, and inexpensive test head manipulator.

BRIEF DESCRIPTION OF THE DRAWINGS

For a better understanding of the nature and objects of the invention, reference should be made to the following detailed description, taken in conjunction with the accompanying drawings, in which.

Like reference numerals refer to corresponding parts throughout the several views of the drawings.

DETAILED DESCRIPTION OF THE INVENTION

Figure 1:
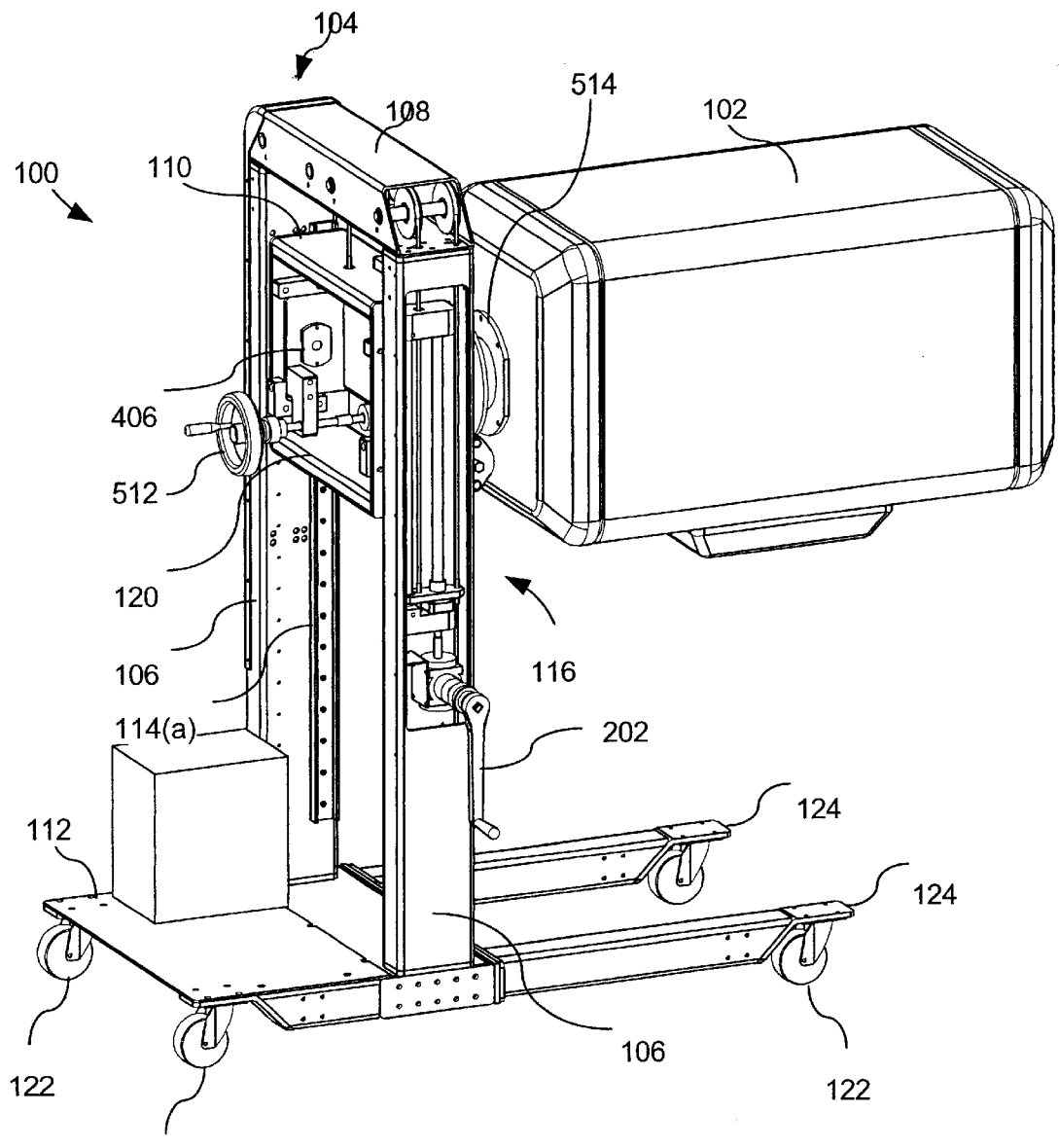
FIG. 1 is an isometric view of a test head manipulator according to an embodiment of the invention.

FIG. 1 is an isometric view of a test head manipulator 100 according to an embodiment of the invention. For ease of reference, a common right angled axis system (XYZ) will be used to assist in describing the invention. The Z-axis is oriented parallel to a plumb or vertical line. The X-axis is oriented horizontally, i.e., perpendicular to the Z axis, while the Y-axis is oriented perpendicularly to both the X and Z axes.

The test head manipulator 100 is used to both move a test head 102 around a testing facility, and to position the test head 102 so that it can accurately dock with an IC device handler (not shown). The test head 102 is any device used to determine whether fabricated IC devices meet design specifications, as described above. Suitable test heads are made by Credence Systems Corporation, Teradyne Inc., Schlumberger Inc., and many others.

Figure 5:
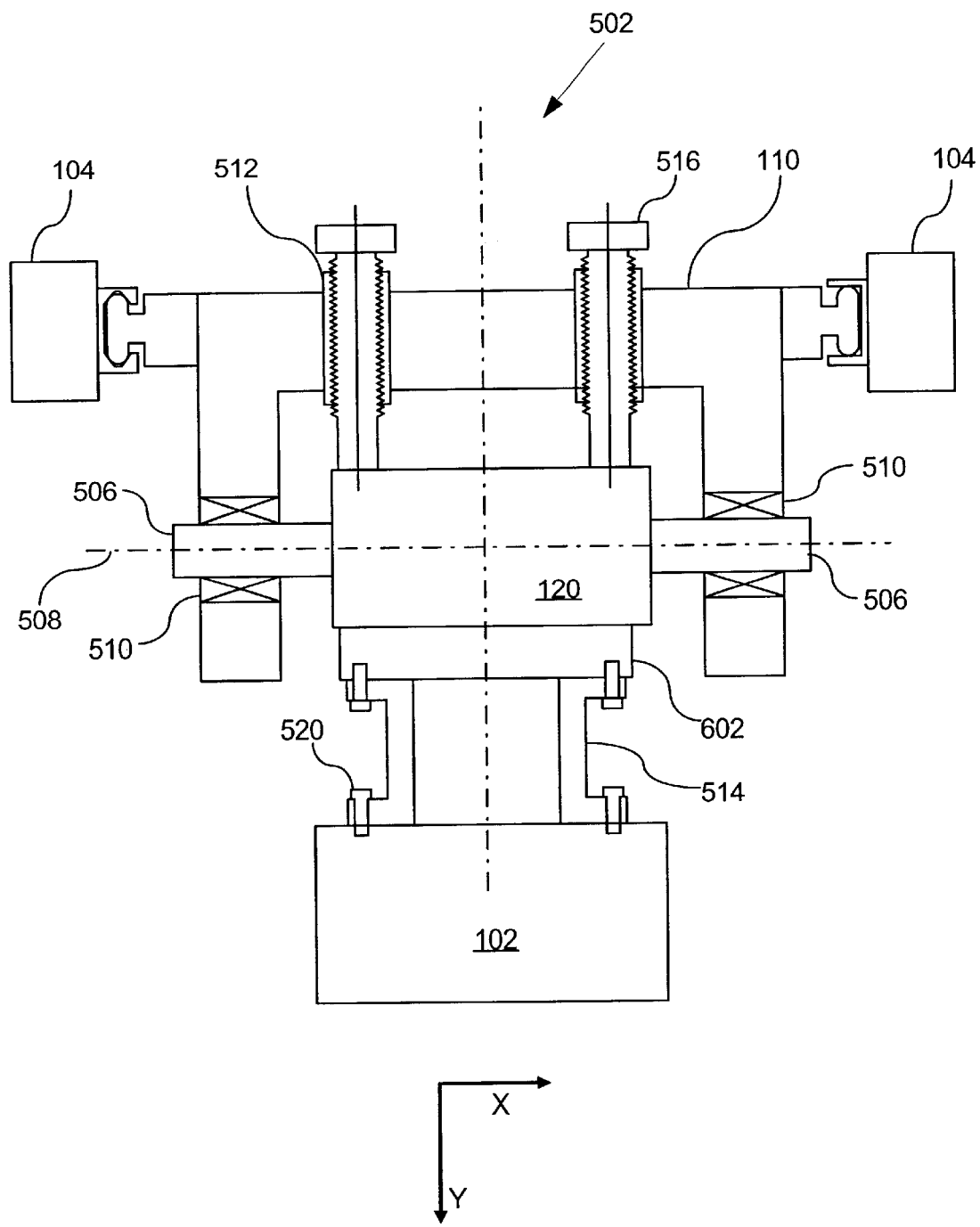
FIG. 5 is a cross sectional block diagram of a pitch drive.

The test head 102 attaches to the test head manipulator 100 as described below in relation to FIG. 5. Briefly, the test head 102 mates with a interface adapter 514 that is coupled to a roll drive 602 (FIG. 5). Similarly, the roll drive 602 (FIG. 6) is coupled to a yoke 120 that is coupled to a carriage 110.

The carriage 110, in turn, couples to a stationary object, such as a frame 104, is described in further detail below in relation to FIGS. 2–4. The frame 104 may be single structure or multiple structures having any suitable shape capable of a) remaining substantially stationary or immobile relative to movement of the carriage 110, and b) supporting the weight of the test head 102.

In a preferred embodiment, the frame is "n" shaped having two vertical upright columns 106 and a horizontal lintel 108 joining the tops of each upright column 106. Each upright column 106 is preferably oriented substantially parallel to the Z-axis. In an alternative embodiment, at least part of the frame 104 may be formed from the testing facility structure. For example, part of the frame may be attached to or form part of the roof trusses or walls of the testing facility structure.

A lift drive 116 is provided for raising and lowering the carriage 110 along a path substantially parallel to the Z-axis. The carriage 110 preferably travels along this path on rails 114(a) and 114(b) (FIG. 2) coupled to the frame 104, as described in further detail below in relation to FIG. 4.

In a preferred embodiment, the columns 106 of the frame 104 couple to a dolly 112. The dolly 112 is a low profile mobile platform that rolls on casters 122, and is used to transport the heavy load of the test head 102 around the testing facility floor. In a preferred embodiment the dolly 112 includes two beams 124 that extend under the test head 102. A caster 122 is coupled near to the end of each beam 124. The dolly 112 is designed such that the center of gravity of the test head manipulator, and the combination of the test head and test head manipulator, is located horizontally between the casters 122. This stabilizes the test head manipulator and prevents it from overturning.

In the preferred embodiment the casters 122 include wheel brakes and swivel locks. When engaged these features assure that the test head manipulator 100 or the test head and test head manipulator 100 combination will stay in position once positioned on the testing facility floor.

Figure 2:
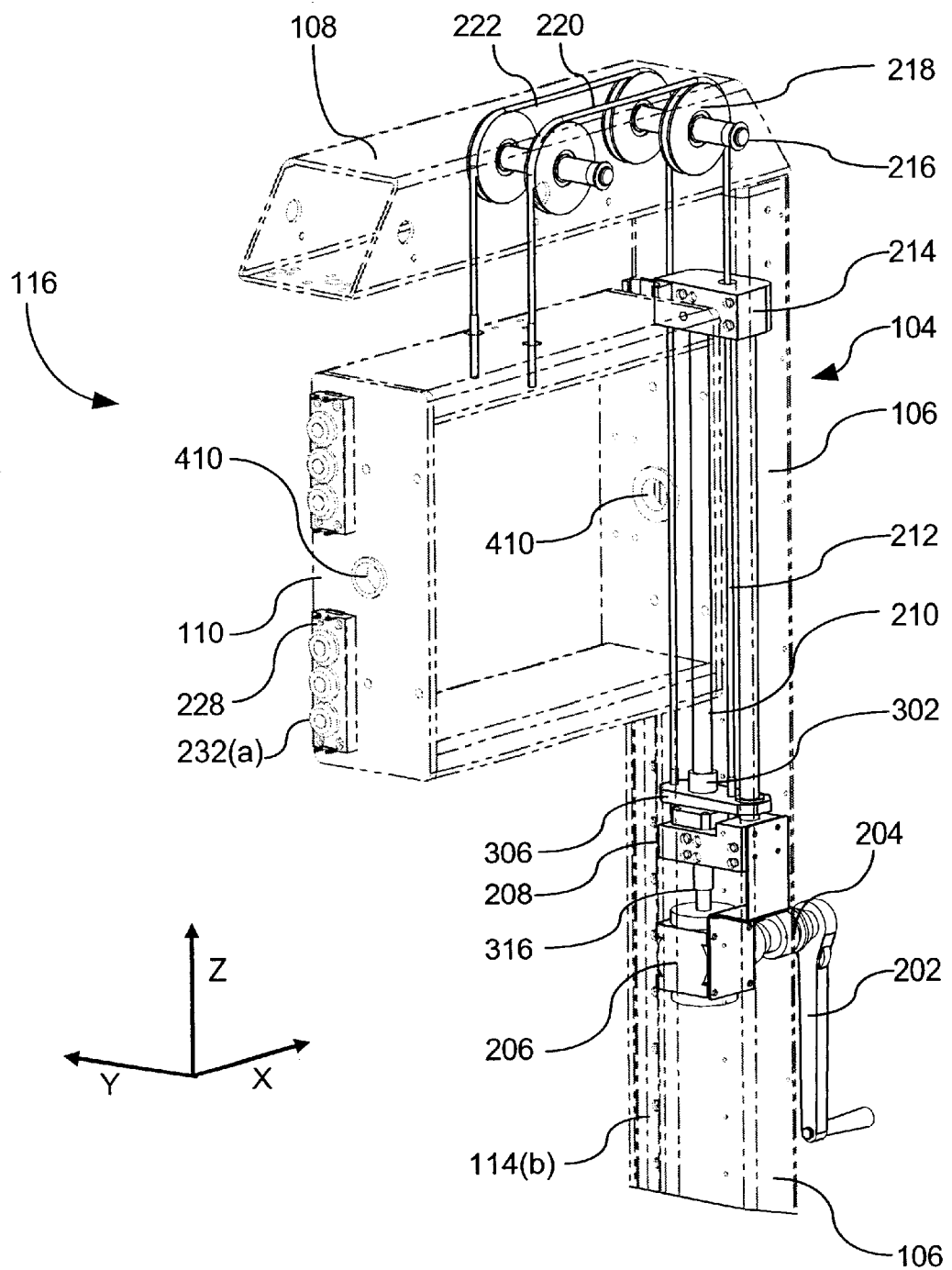
FIG. 2 is a partial isometric view of a lift drive of the test head manipulator shown in FIG. 1.

FIG. 2 is a partial isometric view of the lift drive 116 of the test head manipulator 100 shown in FIG. 1. FIG. 3 is block diagram of the same lift drive 116. The following description refers to both FIGS. 2 and 3. The lift drive 116 forms the most essential component of the test head manipulator 100, as it performs the demanding task of raising and lowering the extremely heavy test head along a vertical path substantially parallel to the Z-axis. As will be shown below, the lift drive 116 also performs the task of securing or locking the test head in its vertical position.

The lift drive 116 preferably comprises one or more bearing blocks 208 and 214 coupled to one of the upright columns 106 of the frame 104 (FIG. 1). Bearing block 208 contains a bearing 308, while bearing block 214 contains an additional bearing 310. A lead screw 210 is preferably rotatably mounted between the bearing 308 and the additional bearing 310, allowing the lead screw 210 to rotate about its longitudinal axis 312. In a preferred embodiment, the longitudinal axis 312 is oriented parallel to the vertical Z-axis shown in FIG. 2.

In a preferred embodiment, bearing 308 is a thrust bearing that provides a non-translation mechanism to prevent the lead screw 210 from translating along its longitudinal axis 312. In yet another embodiment, the non-translation mechanism is a thrust plate (not shown) coupled to the lead screw 210 adjacent one of the bearing blocks 208 or 214. In a preferred embodiment, the additional bearing 310 is a radial bearing.

The lift drive 116 also comprises a lead nut 302 threaded onto the lead screw 210. The internal thread on the lead nut 302 and the external thread on the lead screw 210 have a non-backdrivable pitch, i.e., an axial force placed on the lead nut 302 cannot turn the lead screw 210. Non-backdrivable means that the lead screw 210 will only rotate when driven by the crank 202, as described below. A suitable non-backdrivable thread is an ACME thread of appropriate pitch. It should be appreciated that the thread does not need to run the entire length of the lead screw 210.

The lift drive 116 also includes a non-rotation mechanism that prevents the lead nut 302 from rotating about the longitudinal axis 312. In a preferred embodiment, the non-rotation mechanism includes a shaft 212 coupled to one of the upright columns 106 of the frame 104 (FIG. 1) in an orientation substantially parallel to the longitudinal axis 312 of the lead screw 210. In a preferred embodiment, the shaft is coupled at each of its ends to the bearing blocks 208 and 214, respectively. The non-rotation mechanism also preferably includes a linear bearing 304 connected to the lead nut 302. The linear bearing 304 is slidingly coupled to the shaft 212, thereby allowing it to slide along the shaft parallel to the longitudinal axis 312 of the lead screw 210. In a preferred embodiment, the linear bearing 304 couples to the lead nut 302 by means of a plate 306. This non-rotation mechanism prevents the lead nut 302 from rotating about the longitudinal axis 312. In an alternative embodiment, the non-rotation mechanism may include a slot running the length of the lead screw 210 and a tab connected to the lead nut 302 that engages the slot to prevent the lead nut 302 from rotating about the longitudinal axis 312.

One or more cables 220 or 222 couple the lead nut 302 to the carriage 110. In a preferred embodiment, the two cables 220 and 222 are permanently affixed to the plate 306 at connectors 322. Also, if necessary, the cables 220 and 222 may pass through holes in the bearing block 214, as shown in FIG. 3. The cables 220 and 222 are preferably aircraft quality wire-rope cables. Each cable 220 and 222 is preferably able to carry the entire weight of the test head 102 (FIG. 1) on its own. This allows for redundancy in case one of the cables fails.

The cables 220 and 222 preferably pass over a system of pulleys 218 between the lead nut 302 and the carriage 110. In a preferred embodiment, two pulleys 218 are provided for each cable 220 or 222, such that each cable is threaded through the pulleys through 180 degrees. The axle 216 of each pulley 218 is permanently connected to the frame 104 (FIG. 1). In a preferred embodiment, the pulleys 218 are embedded into the lintel 108 of the frame 104 (FIG. 1). In an alternative embodiment, the lift drive 116 may be positioned directly above the carriage 110, and no pulleys would be required. In this embodiment, the cables would merely connect the lead screw 210 to the carriage 110.

The end of the cables 220 and 222 that are remote from the end of the cables coupled to the lead nut 302, are preferably securely connected to the carriage 110 by means of additional connectors 314.

One end of the lead screw 210 is coupled to a rotational drive mechanism that rotates the lead screw 210. In a preferred embodiment, this rotational drive mechanism comprises of a gear box 206 coupled to the lead screw 210 with a mechanical coupling 316 and driven by a crank 202. The crank 202 is preferably manually rotated by an operator of the test head manipulator 100. Alternatively, a motor may be used to rotate the lead screw 210. The gear box 206 includes an input shaft 318 coupled to the crank 202 and a output shaft 320 coupled to the lead screw 210 via the mechanical coupling 316.

In a preferred embodiment, the gear box 206 is a right angled gear box, as shown. The right angle gear box 206 is preferably non-backdrivable, i.e., torque applied to the output shaft 320 will not turn the gears in the gear box 206. This provides a redundant mechanism for holding the test head 102 in position along the vertical Z-axis.

A clutch 204 is preferably positioned between the crank 202 and the gear box. The clutch 204 is preferably set to slip at a predetermined applied torque. The clutch 204 prevents a force that might damage the test head 102 (FIG. 1) or test head manipulator 100 (FIG. 1) from being applied to the gear box 312. For example, if an operator of the test head manipulator 100 (FIG. 1) is not aware that the test head 102 (FIG. 1) is coupled to a IC device handler, and attempts to raise the carriage 110, the clutch 204 will slip, thereby preventing any damage.

Therefore, in use, to raise the carriage 110 (FIG. 1) and hence the test head 102 (FIG. 1), an operator rotates the crank 202. This rotates the input shaft 318, which rotates the output shaft 320, thereby rotating the lead screw 210. Rotation of the lead screw 210 causes the lead nut 302 to translate along the longitudinal axis 312. This pulls on the cables in a direction parallel to the longitudinal axis 312. The cables in turn translate the carriage 110 vertically upward or downward along a path substantially parallel to the Z-axis. What is more, because of the non-backdrivable nature of the lead nut 302 and lead screw 210, when the operator releases the crank 202, the carriage 110 and the test head 102 (FIG. 1) remain stationary. The weight of the test head 102 (FIG. 1) on the cables, and hence the applied axial force on the lead nut 302, does not cause the lead screw 210 to rotate, and, thereby does not allow the carriage to move vertically downward.

This system overcomes the disadvantages of the prior art by providing a vertical lift mechanism that does not require hydraulics, pneumatics, counterweights, or electric motors. What is more, no additional locking mechanism is required to secure the carriage 110 and test head 102 vertically in place.

Figure 3:
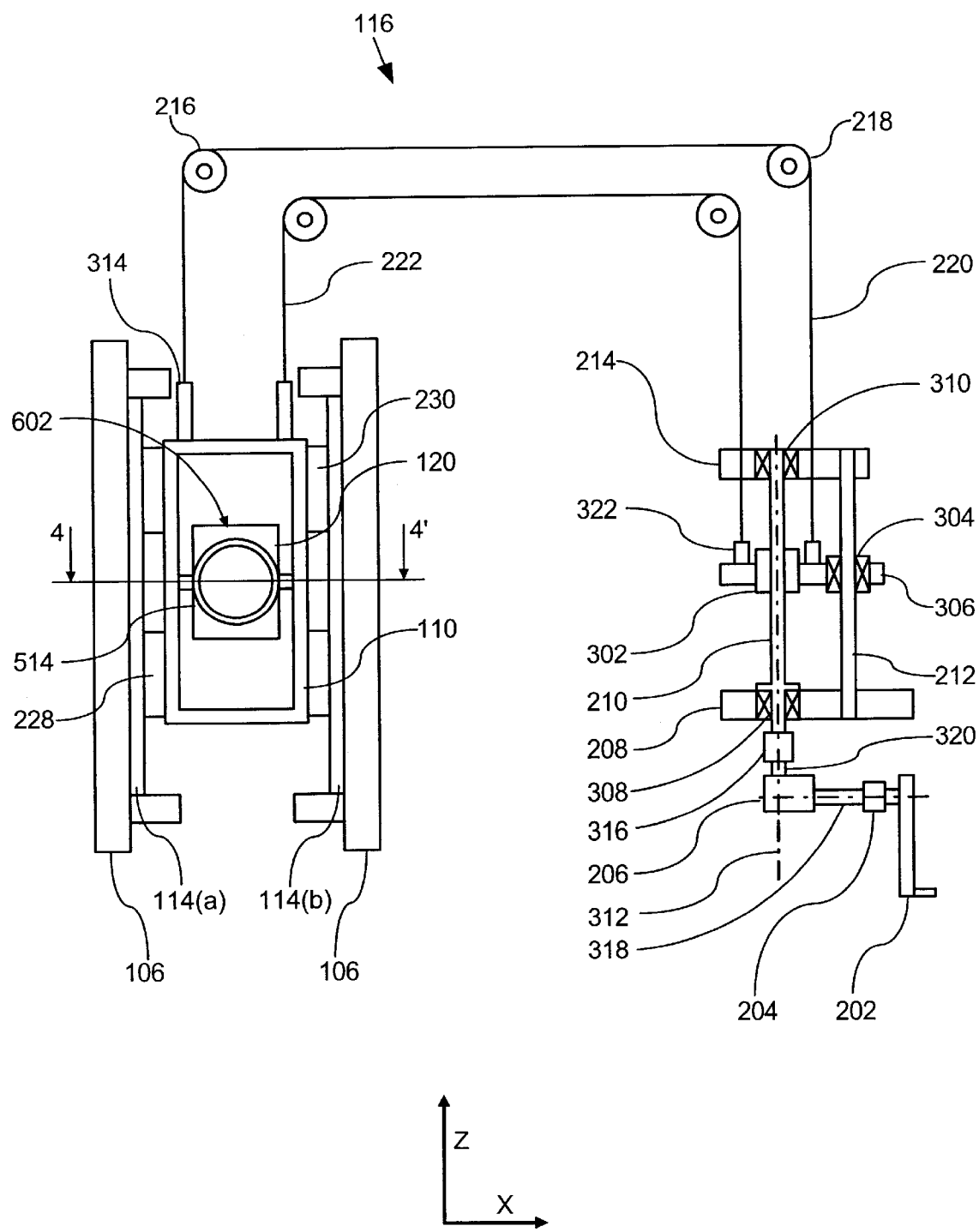
FIG. 3 is block diagram of the lift drive shown in FIG. 2.
Figure 4:
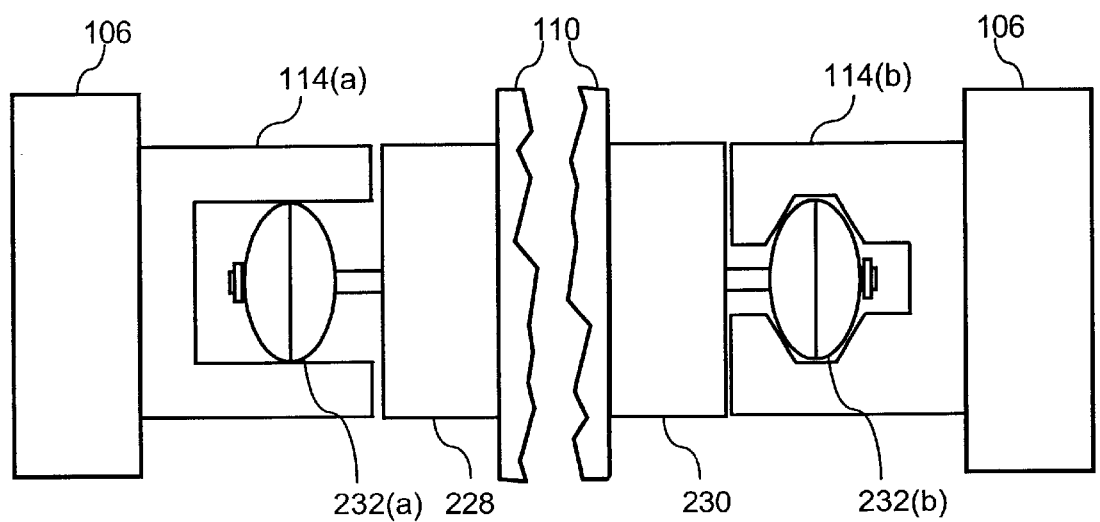
FIG. 4 is a cross-sectional view of rails of the test head manipulator as taken along line 4–4' of FIG. 3.

FIG. 4 is a cross-sectional view of the rails 114(a) and 114(b) as taken along line 4–4' in FIG. 3. As mentioned above, the carriage 110 preferably runs on rails 114(a) and 114(b) along a path substantially parallel to the Z-axis. These rails 114(a) and 114(b) are secured to the upright columns 106 (FIG. 1) of the frame 104 (FIG. 1). In a preferred embodiment, a first one of the rails 114(a) comprises a "U-rail," while a second one of the rails 114(b) comprises a "grooved-rail." The "U-rail" has a "U" shaped track in which a wheel 232(a) can run. This shape prevents motion of the carriage 110 (FIG. 1) along a path parallel to the Y-axis, while allowing the wheel 232(a) to slide vertically on the rail 114(a) along a path substantially parallel to the Z-axis. Likewise, the "grooved-rail" has grooves running the length of the rail in which a wheel 232(b) can run. This shape prevents motion of the carriage 110 (FIG. 1) both along a path parallel to the Y-axis and along a path parallel to the X-axis, while allowing the wheel 232(b) to slide vertically on the rail 114(b) along a path substantially parallel to the Z-axis. Only one of the rails needs to prevent motion of the carriage along a path parallel to the X-axis. If both rails prevented motion of the carriage along a path parallel to the X-axis, additional alignment problems would be introduced into the system. If the rails 114(a) and 114(b) were not perfectly aligned, the carriage could potentially jam in place.

As shown in FIG. 2, wheels 232(a) and 232(b) are preferably attached to mounting blocks 228 and 230 in groups of three. The middle wheel in each combination can preferably be moved along the Y-axis relative to the other two wheels mounted to the block. This movement allows for adjustment for smooth movement of the wheels along the rails. The blocks 228 and 230 attach to the carriage 110. The wheels and blocks resists an overturning moment imposed on the carriage 110 by the cantilevered test head 102.

FIG. 5 is a cross sectional block diagram of a pitch drive 502 according to another embodiment of the invention. The pitch drive 502 is used for rotating the test head 102 about a lateral axis 508, i.e., perpendicular to its longitudinal axis. An interface adapter 514 is configured to attach to the test head 102, preferably by bolting the test head 102 to the interface adapter 514 using bolts 520. The interface adapter 514 is coupled to a roll drive 602 (FIG. 6), which in turn couples to the yoke 120. The yoke 120 is coupled to a pair of pins 506 that can rotate about lateral axis 508 in carriage bearings 510. The X-axis and lateral axis 508 are substantially parallel to one another. The carriage bearings 510 are permanently mounted in the carriage 110. One or more bolts 516 are threaded through flanges 512 attached to the carriage 110. By turning the bolts 516 in the flanges 512, a moment is created on the yoke 120 about the lateral axis 508. This moment is used to adjust the pitch or rotation of the yoke 120, and hence test head 102 (FIG. 1), about the lateral axis 508. A similar bolt arrangement may be provided on the other side of the yoke 120 to rotate the yoke in the opposite direction.

Figure 6:
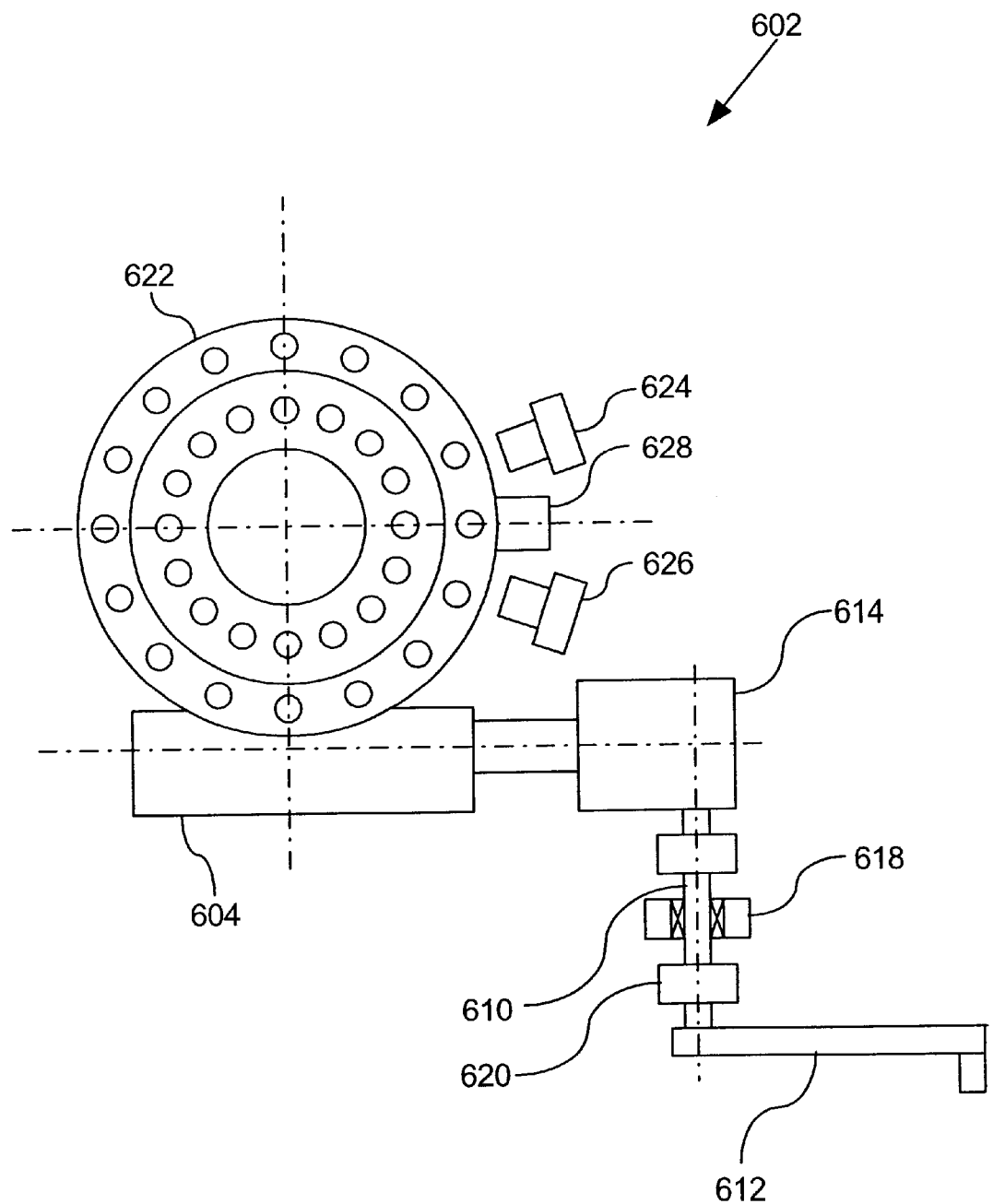
FIG. 6 is a cross sectional block diagram of a roll drive.

FIG. 6 is a cross sectional block diagram of a roll drive 602. In the preferred embodiment, the roll drive 602 includes a slew drive 622, such as the worm drive systems made by Kaydon Corporation. The slew drive comprises a worm gear 604 coupled to a dual contact bearing rotatably coupled the yoke 120 (FIG. 1) and the interface adapter 514. The interface adapter 514 in turn is coupled to the test head 102. A gear box 614, preferably a right angle gear box, and shaft 610 couples the input shaft of the slew drive 622 to a crank 612. A bearing 618 supports the shaft 610. A clutch 620, preferably set to slip at a predetermined applied torque, may be provided to prevent damaging the test head manipulator 100 (FIG. 1) or the test head 102 (FIG. 1) by preventing an operator from over-driving the roll drive 602. A tab 628 is preferably attached to the interface adapter 514 and aligned with a pair of stop blocks 624 and 626. The stop blocks 624 and 626 are positioned to limit the rotation of interface adapter 514 and the test head 102 coupled to it, thereby preventing the test head 102 from being positioned in undesirable angular positions.

The lead angle of the worm gear 604 is chosen such that torque applied to the worm gear will not rotate input shaft of the slew drive 622, i.e., it is not backdrivable. Consequently, the test head will only rotate when driven by the input crank 612. In use the operator rotates crank 612 which rotates the input shaft of the slew drive 622 which in turn rotates the test head 102 coupled to the slew drive 622 with the interface adapter 514.

The foregoing descriptions of specific embodiments of the present invention are presented for purposes of illustration and description. They are not intended to be exhaustive or to limit the invention to the precise forms disclosed, obviously many modifications and variations are possible in view of the above teachings. For example, another lift drive 116 (FIG. 1) may be positioned in the other upright column 106 (FIG. 1) to allow the carriage 110 (FIG. 1) to be raised or lowered from either side of the test head manipulator 100 (FIG. 1). Also, the crank 202 (FIG. 2) can be detached from the test head manipulator 100 (FIG. 1). Still further, a hydraulic, pneumatic, or electric motor may be used to turn the lead screw 210 (FIG. 2) instead of the crank having to be manually turned by an operator. Additionally, the lead screw longitudinal axis 312 could be oriented at any angle and not necessarily parallel to the Z-axis. What is more, the vertical travel of he carriage can be increased by lengthening the length of each cable and providing longer rails. The embodiments were chosen and described in order to best explain the principles of the invention and its practical applications, to thereby enable others skilled in the art to best utilize the invention and various embodiments with various modifications as are suited to the particular use contemplated. Furthermore, the order of steps to position the test head manipulator are not necessarily intended to occur in the sequence laid out. It is intended that the scope of the invention be defined by the following claims and their equivalents.

What is claimed is:

1. A test head manipulator, comprising:
   at least one bearing coupled to a stationary object;
   a lead screw rotatable about its longitudinal axis in said bearing;
   a non-translation mechanism that prevents said lead screw from translating along said longitudinal axis;
   a lead nut threaded onto said lead screw;
   a non-rotation mechanism that prevents said lead nut from rotating about said longitudinal axis;
   a carriage configured to couple with an electronic test head; and
   at least one cable coupling said carriage to said lead nut, such that in use when said lead screw is rotated, said lead nut translates along said longitudinal axis, thereby translating said carriage via said at least one cable.

2. The test head manipulator of claim 1, wherein said stationary object is a frame.

3. The test head manipulator of claim 2, wherein said frame is substantially "n" shaped comprising two upright columns joined by a lintel.

4. The test head manipulator of claim 2, further comprising a dolly coupled to said frame.

5. The test head manipulator of claim 2, wherein said bearing is a thrust bearing that provides said non-translation mechanism to prevent the lead screw from translating along said longitudinal axis.

6. The test head manipulator of claim 1, wherein said non-rotation mechanism comprises:
   a shaft coupled to said stationary object in an orientation substantially parallel to said longitudinal axis; and
   a linear bearing coupled to said lead nut and slidingly coupled to said shaft, where said linear bearing is configured to slide along said shaft.

7. The test head manipulator of claim 1, wherein said carriage further comprises a roll drive for rotating said test head about a test head longitudinal axis.

8. The test head manipulator of claim 1, wherein said carriage further comprises a pitch drive for rotating said test head about a test head lateral axis.

9. The test head manipulator of claim 1, further comprising at least one pulley coupled to said stationary object, where said at least one cable is threaded over said at least one pulley.

10. The test head manipulator of claim 1, further comprising an additional bearing disposed near an end of said lead screw distal from said bearing, where said lead screw is rotatable about its longitudinal axis in said additional bearing.

11. The test head manipulator of claim 10, wherein said additional bearing is a radial bearing.

12. The test head manipulator of claim 1, further comprising a gear box having an input and an output shaft, where said output shaft is coupled to one end of said lead screw.

13. The test head manipulator of claim 12, wherein said gear box is a right angled gear box.

14. The test head manipulator of claim 12, further comprising a clutch coupled to said input shaft.

15. The test head manipulator of claim 12, further comprising a crank coupled to said input shaft.

16. The test head manipulator of claim 1, further comprising a crank coupled to said lead screw.

17. The test head manipulator of claim 1, wherein said lead nut is non-backdrivable along said lead screw.

18. The test head manipulator of claim 1, further comprising at least one rail coupled to said carriage.

19. The test head manipulator of claim 18, wherein said at least one rail is a U-rail slider.

20. The test head manipulator of claim 18, wherein said at least one rail is a grooved-rail slider.

21. A test head manipulator, comprising:
    at least one thrust bearing coupled to a frame;
    a lead screw rotatable about its longitudinal axis in said thrust bearing, where said thrust bearing prevents said lead screw from translating along said longitudinal axis;
    a lead nut threaded onto said lead screw;
    a shaft coupled to said frame in an orientation substantially parallel to said longitudinal axis; and
    a linear bearing coupled to said lead nut and slidingly coupled to said shaft, where said linear bearing is configured to slide along said shaft and prevent said lead nut from rotating about said longitudinal axis;
    a carriage configured to couple with an electronic test head; and
    at least one cable having a first end coupled to said lead nut, and having a second end coupled to said carriage, such that in use when said lead screw is rotated, said lead nut translates along said longitudinal axis, thereby translating said cable and said carriage.

22. The test head manipulator of claim 21, wherein said frame is substantially "n" shaped comprising two upright columns joined by a lintel.

23. The test head manipulator of claim 22, further comprising a dolly coupled to said frame.

24. The test head manipulator of claim 21, wherein said carriage further comprises:
- a roll drive for rotating said test head about a test head longitudinal axis; and
- a pitch drive for rotating said test head about a test head lateral axis.

25. The test head manipulator of claim 21, further comprising a radial bearing disposed near an end of said lead screw distal from said thrust bearing, where said lead screw is rotatable about its longitudinal axis in said radial bearing.

26. The test head manipulator of claim 21, further comprising a gear box having an input and an output shaft, where said output shaft is coupled to one end of said lead screw.

27. The test head manipulator of claim 26, wherein said gear box is a right angled gear box.

28. The test head manipulator of claim 26, further comprising a clutch coupled to said input shaft.

29. The test head manipulator of claim 26, further comprising a crank coupled to said input shaft.

30. The test head manipulator of claim 21, further comprising a crank coupled to said lead screw.

31. The test head manipulator of claim 21, wherein said lead nut is non-backdrivable along said lead screw.

32. The test head manipulator of claim 21, further comprising at least one rail coupled to said carriage.

33. The test head manipulator of claim 32, wherein said at least one rail is a U-rail slider.

34. The test head manipulator of claim 32, wherein said at least one rail is a grooved-rail slider.

35. A test head manipulator, comprising:
- at least one bearing coupled to a frame;
- a lead screw rotatable about its longitudinal axis in said bearing;
- a means for preventing said lead screw from translating along said longitudinal axis;
- a lead nut threaded onto said lead screw;
- a means for preventing said lead nut from rotating about said longitudinal axis;
- a carriage configured to couple with an electronic test head; and
- a means for coupling said carriage to said lead nut, such that in use when said lead screw is rotated, said lead nut translates along said longitudinal axis, thereby translating said carriage via said means for coupling.

* * * * *